(12) United States Patent
Sago et al.

(10) Patent No.: US 7,976,716 B2
(45) Date of Patent: Jul. 12, 2011

(54) SEMICONDUCTOR DEVICE MANUFACTURING METHOD

(75) Inventors: Yasumi Sago, Tachikawa (JP);
Masayoshi Ikeda, Hachioji (JP);
Kazuaki Kaneko, Setagaya-ku (JP);
Takuji Okada, Tachikawa (JP)

(73) Assignee: Canon Anelva Corporation, Kawasaki-Shi, Kanagawa (JP)

( * ) Notice: Subject to any disclaimer, the term of this patent is extended or adjusted under 35 U.S.C. 154(b) by 347 days.

(21) Appl. No.: 12/392,385

(22) Filed: Feb. 25, 2009

(65) Prior Publication Data

US 2009/0197418 A1  Aug. 6, 2009

Related U.S. Application Data

(63) Continuation of application No. 10/375,349, filed on Feb. 28, 2003, now Pat. No. 7,513,063.

(30) Foreign Application Priority Data

Feb. 28, 2002 (JP) ................................. 2002-054863

(51) Int. Cl.
*B44C 1/22* (2006.01)

(52) U.S. Cl. .......................................... 216/67; 34/578

(58) Field of Classification Search ........................ None
See application file for complete search history.

(56) References Cited

U.S. PATENT DOCUMENTS

| 5,083,373 | A | * | 1/1992 | Hamburgen | ................ 29/890.03 |
| 5,194,118 | A | | 3/1993 | Shinohara | |
| 5,595,337 | A | | 1/1997 | Demaray et al. | |
| 5,640,852 | A | | 6/1997 | Atlas | |
| 6,173,508 | B1 | * | 1/2001 | Strohmeyer, Jr. | ................ 34/578 |
| 6,391,147 | B2 | * | 5/2002 | Imafuku et al. | ........... 156/345.47 |
| 6,440,221 | B2 | | 8/2002 | Shamouilian et al. | |
| 2001/0030024 | A1 | | 10/2001 | Sago et al. | |

FOREIGN PATENT DOCUMENTS

| JP | 6-172988 A | 6/1994 |
| JP | 8-031755 A | 2/1996 |
| JP | 8-159681 A | 6/1996 |
| JP | 9-293809 A | 11/1997 |
| JP | 10-047879 A | 2/1998 |
| JP | WO 99/41778 A1 | 8/1999 |

OTHER PUBLICATIONS

Chinese Office Action dated May 27, 2005 (with English translation).
Japanese Office Action dated Jul. 4, 2006 (with English translation).

* cited by examiner

*Primary Examiner* — Binh X Tran
*Assistant Examiner* — David A Cathey, Jr.
(74) *Attorney, Agent, or Firm* — Buchanan Ingersoll & Rooney PC

(57) ABSTRACT

A method of using a heat exchanger efficiently and uniformly to cool or heats portions to be controlled to a prescribed temperature, and then continuously carry out stable processing. The heat exchanger is constructed by arranging partition walls between two plates to form a fluid channel and a fin parallel with the channel or inclined by a prescribed angle on each of the two plates insides the channel so that the plate or a member in contact with the plate is cooled or heated with the fluid flowing through the channel.

1 Claim, 6 Drawing Sheets

SEMICONDUCTOR DEVICE MANUFACTURING METHOD

CROSS-REFERENCE TO RELATED APPLICATIONS

This application claims the benefit of Japanese Patent Application No. 2002-054863, filed on Feb. 28, 2002, in the Japanese Intellectual Property Office, and is a continuation application of U.S. application Ser. No. 10/375,349, filed Feb. 28, 2003, the entire contents of which are incorporated herein by reference.

BACKGROUND OF INVENTION

1. Technical Field

The present invention relates to a substrate processing apparatus and, more particularly, to a semiconductor processing apparatus equipped with a heat exchanger having an excellent temperature control performance.

2. Related Art

A substrate, an opposite electrode, a target and the like in plasma processing apparatuses such as a sputtering apparatus or an etching apparatus used for manufacturing a semiconductor device or a liquid crystal display panel are heated by the plasma or the ion bombardment. Therefore, in order to prevent a temperature rise and perform stable processing continuously, a cooling mechanism is installed, which maintains them at a predetermined temperature.

For example, in a cooling mechanism of sputtering target, as shown in FIG. 6, a depression which a cooling water pass through is formed in the rear face of a backing plate 102 on which a target 101 is fixed, and the backing plate is fixed on a target holder 103 so as to cover the depression (JP6-172988A). Fins 104 are provided in the depression to reinforce the plate and to form a cooling water channel 106. The target 101 is cooled with the cooling water which is introduced into channel 106 from a cooling water inlet port 105 and is discharged from an outlet 107. Thus, with the reinforcement fin 104, the backing plate can be made thinner, which therefore improves the efficiency to cool the target Similarly, the coolant channels are also provided inside a substrate holder and an opposite electrode of etching apparatus. The coolant flowing through the channel maintains the substrate and the gas emitting plate at a predetermined temperature to attain stable processing.

However, when semiconductor devices such as LSI are requested to have the higher density and the higher degree of integration to a design rule of 0.13 μm, the cooling capacity of cooling mechanism became insufficient and caused to increase the temperature distribution over the substrate, and made it difficult to maintain the uniformity of etching rate. Therefore, it was necessary to increase the cooling capacity by lowering the temperature of coolant, or increasing the flow rate. However, this method increases the loads of a coolant pump and, for example, a chiller of thermostatic bath, resulting in cost rise of apparatus.

Furthermore, since the shape of, e.g., the contact holes to be formed is sharply changed with the temperature of substrate, the temperature rise must be as small as possible during the processing for a single substrate from the etching processing beginning to the end. Accordingly, the heat transfer of cooling mechanism should be improved so as to be able to adopt the coolant at a higher temperature.

Then, the present inventors have investigated and examined the relation between the internal structure of a heat exchanger and the cooling capacity, and found that the cooling efficiency is improved by providing fins inside the cooling channels and further improved without the conductance drop of flow by providing the fins nealy parallel with the flow direction.

The spacing of fins is preferably made as small as possible in order to further increase the cooling efficiency. However, when the spacing becomes small to a certain degree, a cutting tool cannot enter into the groove between the fins. That is, the fin structure wherein the spacing is less than the width of cutting tool has not been able to be fabricated and in other words the higher fin density has been actually impossible. Then, the present inventors attempted to fix the fins with, e.g., blazing and found that the heat transfer was sometimes decreased in the blazed positions. The fins were not aligned precisely, which caused the non-uniform flow. Thus, the temperature distribution became non-uniform over the whole substrate surface to deteriorate the etching characteristics and its uniformity.

SUMMARY OF INVENTION

This invention has been accomplished in order to solve these problems. That is, the object of this invention is to realize a heat exchanger which efficiently and uniformly cools or heats portions to be maintained at a predetermined temperature, and then to provide a substrate processing apparatus which can continuously carry out stable processing, by disposing the heat exchanger in a substrate holder, a gas emitting mechanism, or a process chamber wall.

A substrate processing apparatus of this invention comprises a substrate holder for holding a substrate and a gas emitting means arranged to face said substrate holder in a process chamber equipped with a gas introduction means connected to said gas emitting means and an exhaust means, to process a substrate with a gas or its reaction product emitted from said gas emitting means toward the substrate, wherein at least one of said substrate holder, said gas emitting means, and said process chamber has a heat exchanger, and said exchanger is constructed by arranging partition walls between two plates to form a fluid channel and a fin parallel with said channel or inclined by a prescribed angle on each of said two plates insides said channel so that said plate or a member in contact with said plate is cooled or heated with a fluid flowing through said channel.

In addition, protuberant portions are provided on at least one of said two plates, which serve as the partition walls to form said channel after said two plates are fixed.

Thus, by arranging the fins on each of two plates and then fixing two plates together so that each fin on one plate may come in between two fins on another plate, a heat exchanger having a high-density fin configuration inside the channel can be realized. The heat exchanger thus constructed remarkably improves the heat transfer, and then the controllability of temperature and the uniformity of temperature over whole surface. If such a heat exchanger is used for a substrate holder, a gas emitting means and the like of substrate processing apparatus, the uniformity and the stability of processing can be greatly improved. Furthermore, a fluid circulating pump and a thermostatic bath can be made compact, resulting in the cost reduction of whole apparatus.

Here, the fins as long as the entire channel length can be arranged or a plurality of the fins having a prescribed length can be arranged with a prescribed interval to cover whole channel length.

Moreover, the fin arranged on one plate of said two plates is preferably overlapped with that arranged on another plate, as seen from the perpendicular direction to the flow direction of fluid. This configuration further improves the heat transfer. Then, since the fluid channel is not completely separated by the fins (that is, the fins are not connected to another plate), the fluid can move among respective sub-channels divided by the fins. Therefore, the temperature uniformity can be obtained even when each sub-channel has a different conductance.

The channel is fabricated to have the same cross section area over the entire length and is uniformly arranged over the entire said plate.

In addition, the cross section length (i.e., the surface length in contact with the fluid in a cross section of the channel perpendicular to the flow direction) is preferably set to be three times or more as compared with that of channel where no fins are arranged. That is, if the contact area with the fluid in the channel of, e.g., the substrate holder is made three times or more, the temperature uniformity of 0.2° C. or less can be attained over the whole substrate surface.

Moreover, a connection fin which connects said two plates and is wider than said fin is provided in the channel. Since the heat inputted into one plate transmits to another plate through the connection fin, this configuration is preferably used for a substrate cooling mechanism wherein the heat is inputted into one plate.

In these drawings, numeral 1 denotes process chamber; 2 opposite electrodes (gas emitting means); 3 frame; 4 gas distribution plate; 5 heat exchanger; 6a gas plate; 5a gas passage; 5b coolant channel; 5c fin; 7 substrate holding electrode (substrate holder); 8 heat exchanger; 8c channel; 8d fin; 9 electrostatic chuck; 10 gas introduction pipe; 12a, 12b insulator; 13 valve; 14, 15 high frequency power source; 16 blocking capacitor; 17 DC power source; 18 high frequency cut filter; 19 ejector pin; 20 through hole; 21 bellows; 22 gas supply system; 40 substrate; 50, 60 plate member; 51 upper plate fin; 61 lower plate fin; 62 partition wall (channel wall); 62' protuberant portion; 70 channel.

DETAILED DESCRIPTION OF PREFERRED EMBODIMENTS

The preferred embodiments of this invention will be explained with reference to drawings.

The first embodiment of this invention is shown in FIG. 1. FIG. 1 is a schematic sectional view showing a part of heat exchanger used for a substrate processing apparatus of this invention.

Figure 1A:
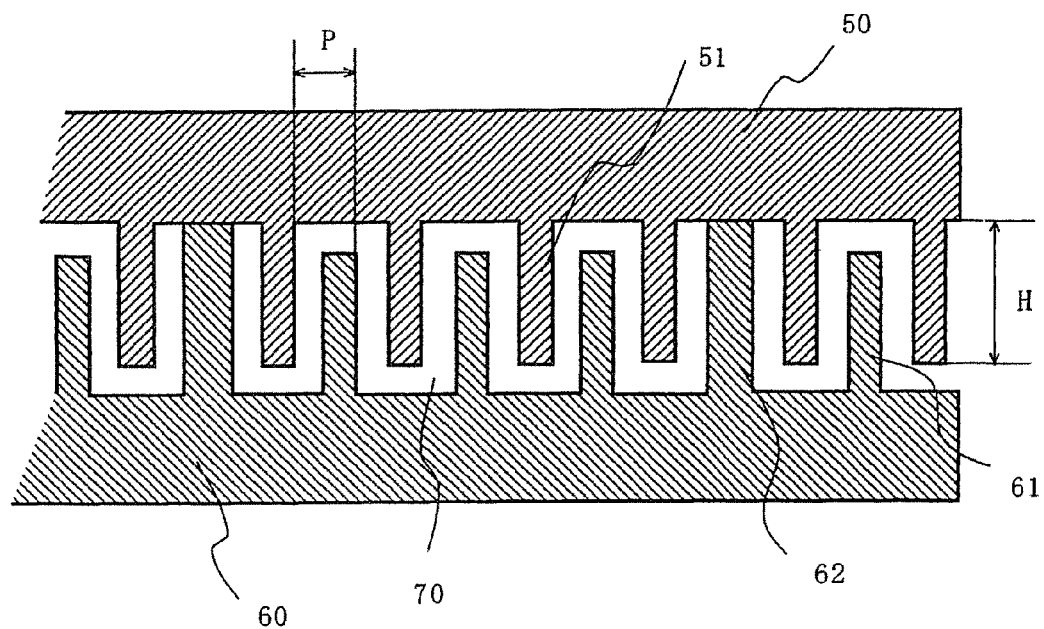
FIG. 1 is a schematic cross sectional view showing an example of a heat exchanger of this invention.

In a heat exchanger shown in FIG. 1A, the space between two plates 50, 60 is divided with partition walls (fluid channel walls) 62 to form a fluid channel 70. A fluid introduction port and an exhaust port (not illustrated) are disposed at respective ends of the fluid channel. Moreover, a lot of fins 51, 61 are arranged on upper plate 50 and lower plate 60 inside the channel.

The height of the fin is set so that the ends of upper plate fins 51 and the lower plate fins 61 overlap each other. The inside of channel is not separated completely by the upper plate fins 51 or the lower plate fins 61 so that the fluid moves between sub-channels formed by the fins. The cooling capacity can be made uniform over the entire heat exchanger even when each sub-channel has a different conductance.

Here, there is no restriction on the length of each fin. That is, the fins having a prescribed length may be arranged with a prescribed interval over the entire length of channel, or the fins having a whole channel length may also be arranged. The fin is attached in parallel with the flow direction of the fluid, as shown in the drawing. However, when the fin is short, the fin may be arranged inclined by a prescribed angle (for example, about 30 degrees or less) from the direction of channel.

Here, the fin pitch P is 5 mm or less, and preferable to be 3 mm or less. Moreover, the fin height H is preferable to be 10-20 mm. The heat transfer between the fluid and the upper or lower plate is remarkably improved by arranging fins having such height with high density, which makes it possible to precisely control the temperature of, e.g., a substrate in contact with the upper plate.

Furthermore, it is desirable to arrange the fins so that the entire surface length contacting the fluid in the cross section of the channel is three times or more as compared with that of channel where fins are not provided. Thereby, the cooling efficiency is further improved and therefore the loads of a pump for circulating the fluid and a chiller used for a thermostatic bath are reduced. That is, compact and simple pump and chiller can be adopted. As will be described later, by using the heat exchanger in the substrate holder of etching apparatus, the temperature uniformity of +0.2° C. or less over the whole substrate surface can be attained even with the same condition of the flow rate and the temperature of coolant, which make possible the etching uniformity of ±1.0% or less under the 0.13 μm design rule.

Since a cutting tool cannot enter narrow and deep grooves, the heat exchanger with a high-density fin configuration having a large ratio of the height to the spacing of fins is fabricated in the following manner.

Figure 1B:
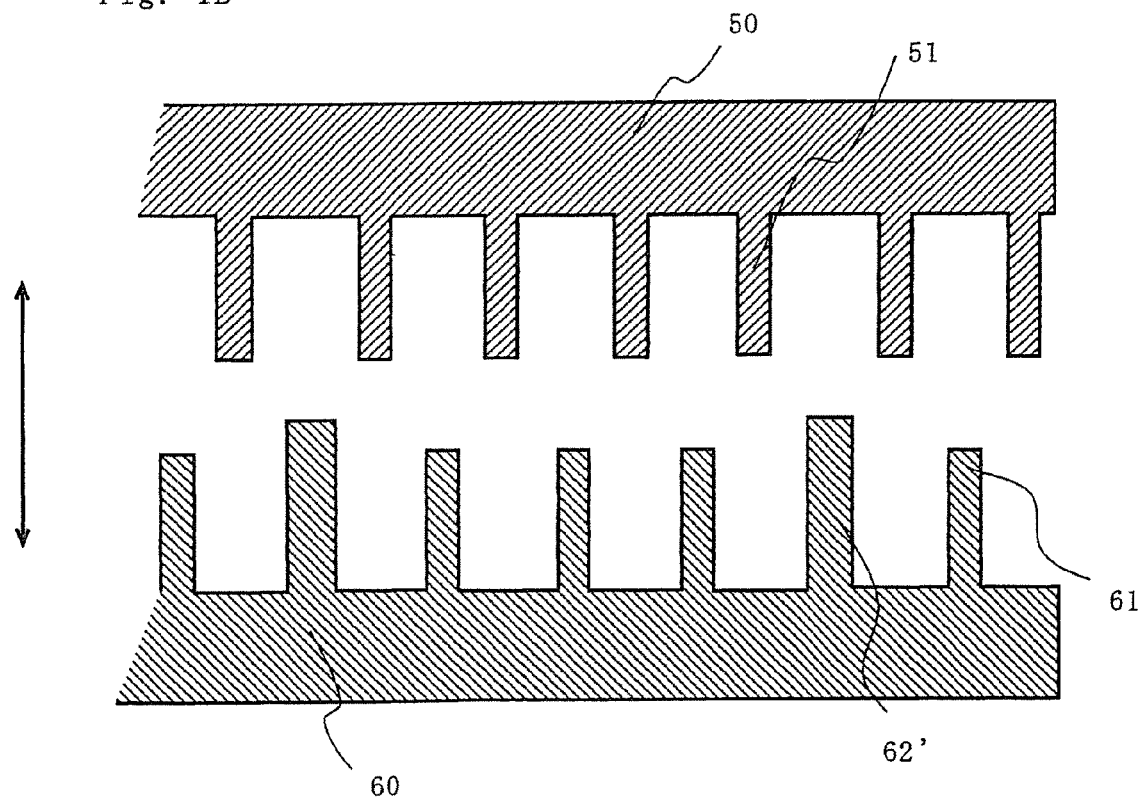

As shown in FIG. 1B, the fins are formed on lower plate 60 and upper plate 50 as many as possible using a cutting tool. That is, the lower plate member 60 is cut to have fins 61 and protuberant portions 62' which become channel walls 62. Similarly, the upper plate member is cut to have fins 51. Next, the lower plate 60 and the upper plate 50 are put together so that each fin of one plate comes in between two fins of another plate, and then fixed by bonding with brazing or adhesive the contacting parts of the end plane of the protuberant portions 62' of the lower plate and the upper plate. Here, the method is preferably used wherein a silver brazing is attached on the contacting parts, two plates are put together and the silver brazing is melted by laser irradiation to bond two plates. This method can reduce the amount of silver brazing used, and avoid the problem that the silver brazing melts and gathers to clog the channel. Thus, it becomes possible to form the fin arrangement in which the spacing between fins is narrower than the half of the minimum into which the cutting tool can enter, and therefore to construct a heat exchanger having a large heat transfer coefficient.

In the example shown in FIG. 1A, the fins of one plate are not connected to another plate. However, some of the fins can be replaced for a connection fin which connected two plates.

In this case, the connection fin preferably has a broad width as compared with the ordinary fins. In this configuration, the heat inputted into, e.g., the upper plate can be transmitted to the lower plate through the connection fin, which make it possible to further increase the heat tranfer as well as the mechanical strength of the heat exchanger.

Here, the performance of heat exchanger of FIG. 1 having seven fins in the channel is compared with the conventional heat exchanger having no fin.

The height and width of channel are 17 mm and 21.4 mm, respectively in the heat exchanger shown in FIG. 1. In this channel, seven fins, each of which has a height of 15 mm and a width of 1.8 mm, are arranged with a spacing of 1.1 mm. The heat exchanger which has such a high-density fin configuration is constructed by the method mentioned above.

When the fluid (Ausimont K.K, GALDEN HT135) having physical properties shown below is made flow into the channel at a pressure of 3 kgf/cm² and at a flow rate of 10 l/min, the heat transfer coefficient and temperature difference between the fluid and upper plate can be obtained in the following manner.

The heat transfer coefficient hc of fluid with the upper plate or lower plate is approximately given by the following equation.

$$hc = 0.023 \cdot v^{-0.4} \cdot \lambda^{0.6} \cdot \rho^{0.4} \cdot Cp^{0.4} \cdot u^{0.8} \cdot d^{-0.2}$$

Here, v denotes kinematic viscosity; λ thermal conductivity; ρ density; Cp specific heat; u representation velocity; and d representation length.

In the above-mentioned fin configuration, the cross section length L of channel is 286.8 mm, and the cross section area S of channel is 174.8 mm². The representation length d is given by the cross section area of channel divided by half of cross section length. That is, d=S/(L/2)=1.218 mm.

A flow rate V=1.667×10⁻⁴ m³/s and therefore the representation velocity u=V/S=0.954 m/s.

On the other hand, in the conventional channel in which no fins are provided, the cross section length L'=76.8 mm and cross section area S'=363.8 mm². Therefore, the representation length d'=9.47 mm and representation velocity u'=0.458 m/s.

Therefore, the ratio of the heat transfer coefficient of hc/hc' is given by:

$$hc/hc' = (u/u')^{0.8} \cdot (d/d')^{-0.2}$$
$$= (0.958/0.458)^{0.8} \cdot (1.218/9.48)^{-0.2}$$
$$= 2.72.$$

That is, by arranging the above-mentioned fins in the channel, the heat transfer coefficient increase to 2.72 times.

The physical properties of GALDEN described below are substituted into the equation.
  Kinematic viscosity v 10⁻⁶ m²/s
  density ρ 1.73×10³ kg/m³
  heat conductivity A 0.065 W/m·° C.
  specific heat Cp 0.966 kJ/kg·° C.
Thus, the heat transfer coefficient hc is $$hc = 1273 \text{ W/(m}^2\cdot{}^\circ\text{C.)}.$$

Next, the substrate holder of etching apparatus having the above-discussed heat exchanger is examined. If the heat Q incident to the substrate during etching process is assumed to be 1.25 W/cm², the temperature difference ΔT between the fluid and the upper plate is obtained in the following manner.

The actual heat transfer of the heat exchanger shown in FIG. 1 becomes (L/L') times (i.e., 3.73 times) by taking into consideration the surface area of fins, and then becomes 7.47 times by further taking into consideration both plates of the upper and lower plates.

Therefore, the temperature difference ΔT between the coolant and the upper plate or the lower plate is given by;

$$Q = hc \cdot \Delta T$$

$$1.25 \times 10^4 \text{(W/m}^2\text{)} = 1273 \text{ (W/m}^2\cdot{}^\circ\text{C.)} \cdot 7.47 \cdot \Delta T$$

and, ΔT=1.31° C.

Similarly, the temperature difference ΔT' for the conventional exchanger having no fins in the channel is given as

ΔT'=13.5° C.

Therefore, using the fin configuration shown in FIG. 1 for cooling mechanism, the temperature of coolant can be set to be 12° C. higher than that of conventional channel, which makes it possible to reduce the load of a chiller of thermostatic bath and therefore adopt a simple thermostatic bath. The flow rate of coolant can also be reduced, meaning that a compact pump and thermostatic bath can be used. Furthermore, the uniformity of etched shape is improved, as will be described later.

Figure 2:
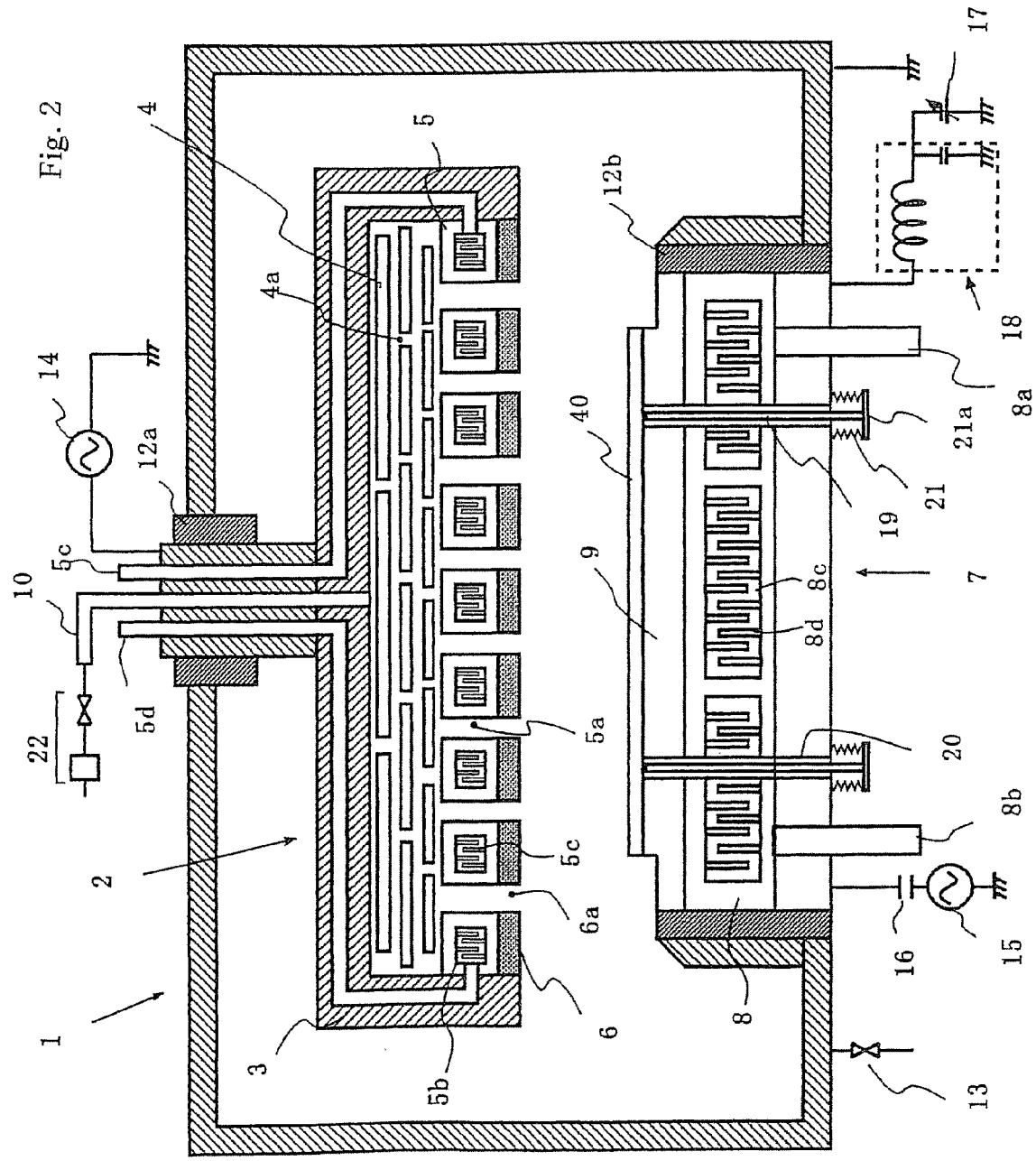
FIG. 2 is a cross sectional view showing an example of etching apparatus of this invention.
Figure 3:
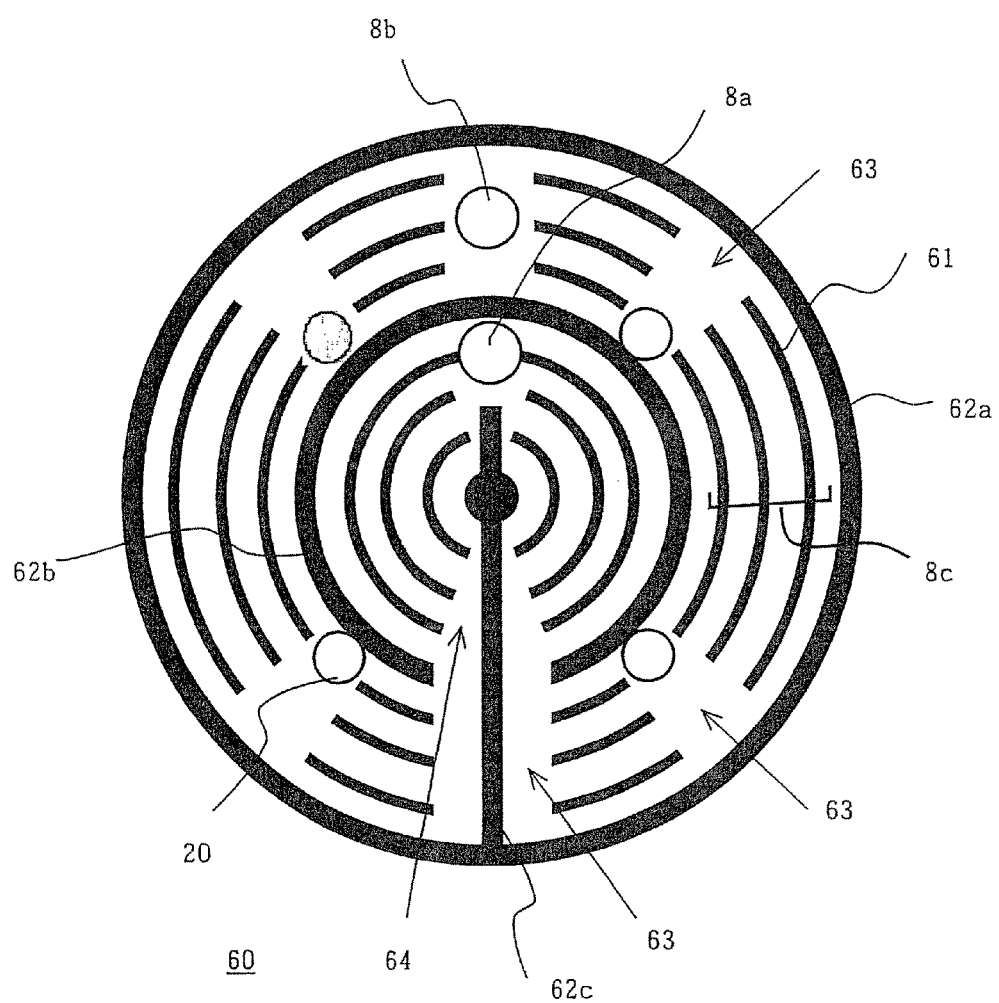
FIG. 3 is a cross sectional view showing an example of heat exchanger used for a substrate holding electrode of etching apparatus.

The second embodiment of this invention is shown in FIGS. 2 and 3.

FIG. 2 is a cross sectional view showing an example of etching apparatus of this invention. As shown in FIG. 2, an opposite electrode (gas emitting means) 2 and a substrate holding electrode (substrate holder) 7 for holding a substrate 40 are arranged facing each other, and are fixed through insulators 12a and 12b in a process chamber 1 of etching apparatus, respectively. The inside of the process chamber is connected with an exhaust means (not illustrated) through a valve 13. The opposite electrode 2 is connected with a first high frequency power source 14 for generating plasma as well as with a gas introduction means comprising a gas introduction pipe 10 and a gas supply system 2 which is composed of a gas cylinder, a mass flow controller, a stop valve and the like.

The opposite electrode 2 comprises; a gas distribution mechanism in which one or a plurality of gas distribution plates 4 having a number of small holes 4a are arranged; a heat exchanger 5 having a number of gas passages 5a; and a gas plate 6 having a number of gas emitting holes 6a which are communicated with gas passage 5a. These members are placed in and fixed to a cylindrical frame 3. The fins mentioned above are provided on the upper and lower plate in coolant channel 5b of heat exchanger 5. The coolant is introduced into coolant channel 5b through a coolant introduction pipe 5c and a pipe disposed inside, e.g., frame 3, and is discharged through a coolant exhaust pipe 5d.

A process gas supplied to the inside of the opposite electrode through gas introduction pipe 10 passes through small holes 4a of gas distribution plates 4 and uniformly spreads in the gas distribution mechanism. Then, the process gas passes through gas passage 5a of heat exchanger 5 and uniformly flows out of gas emitting holes 6a of the gas plate 6 into process chamber 1.

In contrast, the substrate holding electrode 7 is composed of a heat exchanger 8 having coolant channels in which the fins are arranged, and an electrostatic chuck 9 disposed thereon for electrostatically holding the substrate. The coolant is introduced through coolant introduction pipe 8a, and is discharged through coolant exhaust pipe 8b. The substrate is cooled to a predetermined temperature with this coolant through an electrostatic chuck. The substrate holding electrode 7 is connected to a second high frequency power source 15 for bias control of substrate, and a DC power source 17 for electrostatically holding a substrate. In addition, a blocking capacitor 16 and a high frequency cut filter 18 are disposed between second high frequency power source 1S and DC power source 17, and substrate holding electrode 7, to prevent mutual interference.

Furthermore, through holes 20 are formed in substrate holding electrode 7. Ejector pins 19 are installed inside the through holes to move substrate 40 up and down when transferring the substrate. The inside of through hole is separated from the atmosphere by bellows 21 and bottom plate 21a. The ejector pin 19 is fixed on bottom plate 21a.

Then, the heat exchanger 8 used for substrate holding electrode 7 is explained with reference to FIG. 3. FIG. 3 is a cross sectional view showing the lower plate of heat exchanger 8. The fluid channels are formed using partition walls (channel walls) 62a, b, c, wherein wall 62a has no end, i.e., it is circular. The coolant flows in channels 8c from a coolant introduction port 8a to an exhaust port 8b. With fins 61 provided in the channels, the contact area with the coolant is increased to improve the cooling capacity. The fins 61 each have an end. The fins are also provided on the upper plate (not shown) so that each fin comes between two fins of lower plate.

Thus, the configuration in which fins are arranged in the channels is preferable as compared with the configuration in which the longer channels are employed, since the channels have larger conductance to increase the flow rate. Consequently, the cooling efficiency is remarkably improved. Moreover, two channels may have the same conductance because the channels are constructed to be symmetrical with respect to the line which connects introduction port 8a and exhaust port 8b as shown in FIG. 3. Thus, the uniformity of substrate temperature is further improved.

The fins shown in FIG. 3 are not continuous body having the entire channel length, but are divided. In this case, each sub-channel desirably has a deviation of ±20% or less of the average length between dividing positions 63, which reduces the temperature difference due to the heat transfer difference to cope with the processing under the 0.13 μm design rule.

The through holes 20 formed for the ejector pins in the substrate holding electrode are preferably arranged at the portion nearer to the center among the parallel sub-channels, which makes the difference of conductance small between the inside sub-channel and outside sub-channel, and further improves the uniformity of substrate temperature.

In the vicinity of where the extensions of fins cross the channel wall, the conductance adjustment gaps 64 are provided to adjust the difference of the conductance among the sub-channels. In the case of the drawing, the gap between the fin end and the channel wall is made narrower for the inner fin. In addition, it is also possible to adjust the width of each sub-channel in order to compensate the difference of sub-channel length.

By adopting the above-mentioned configurations, the heat exchanger can be realized which has a high cooling efficiency and an excellent temperature uniformity over the whole surface.

The etching processing using the apparatus shown in FIG. 2 is carried out as follows. The bottom plates 21a of bellows 21 are pushed up with a driving mechanism to lift ejector pins 19 up. In this state, the robot hand holding a substrate is inserted through a gate valve (not illustrated) to place the substrate on ejector pins 19. Then, the ejector pins are moved down to place substrate 40 on electrostatic chuck 9. A predetermined electric voltage is applied to the chuck from DC power source 17 to fix the substrate.

Subsequently, the process gas is supplied from gas supply system 22 into process chamber 1 through gas introduction pipe 10 and opposite electrode 2, and the pressure is set at a predetermined value. Then, the VHF high frequency electric power (for example, 60 MHz) is supplied to opposite electrode 2 from first high frequency power source 14, while the HF high frequency electric power (for example, 1.6 MHz) is supplied to substrate holding electrode 7 from second high frequency power source 15. The high-density plasma is generated with the aid of high frequency electric power of VHF band, and the activated species is generated to etch the substrate surface. The energy of ions can be controlled independently of plasma density by the high frequency electric power of HF band. That is, any etching characteristics can be obtained by suitably selecting two high frequency electric powers.

As has been mentioned, since the substrate holding electrode of this invention has a high cooling efficiency, the coolant temperature can be set high compared with the prior art. This reduces the load of cooling mechanism and greatly improves the etching characteristic. That is, the stable etching processing can be carried out with sufficient productivity, which is explained below.

Figure 4:
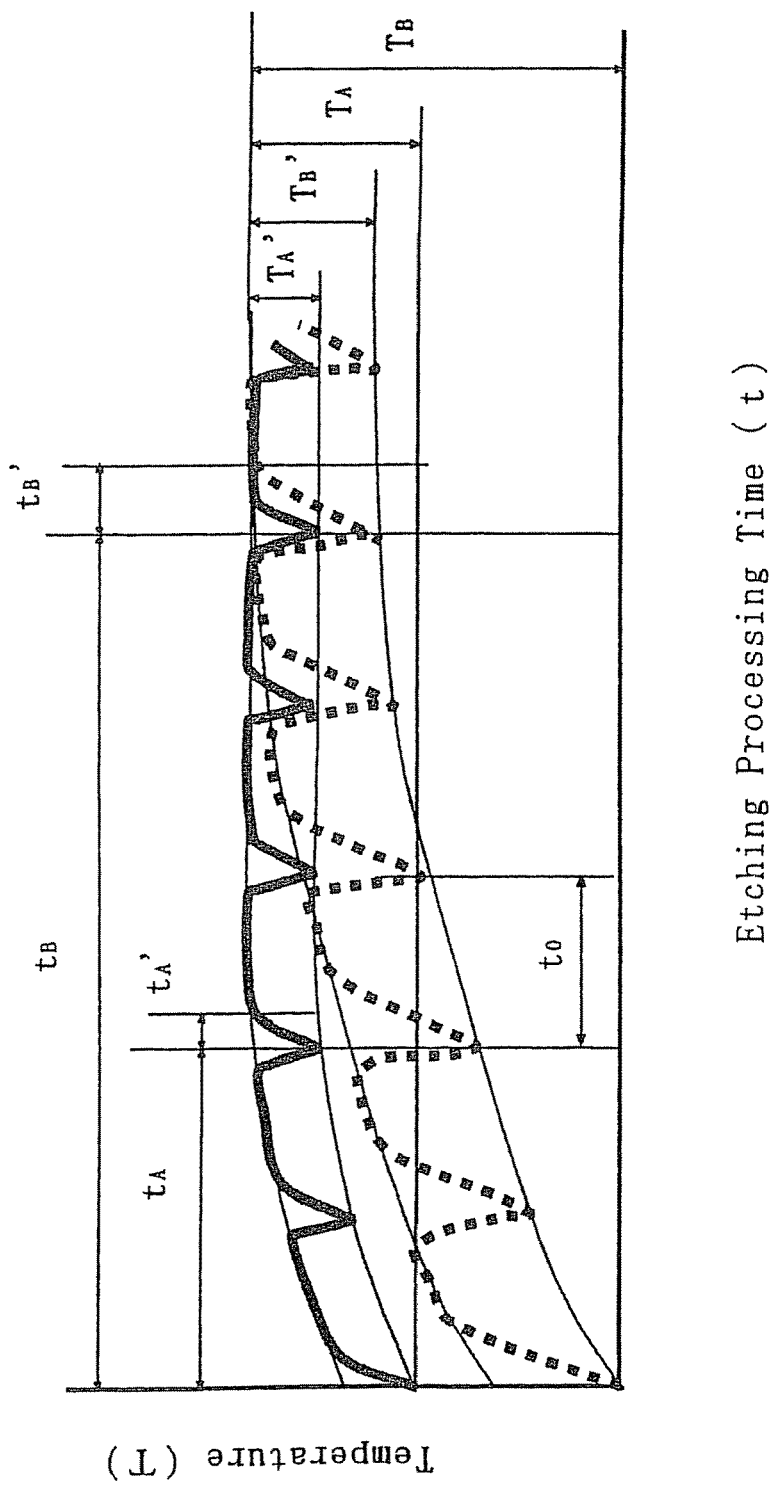
FIG. 4 is a conceptual graph showing the temperature change of the substrate (substrate holding electrode) during etching processing.

FIG. 4 is a conceptual graph showing the surface temperature change of the substrate holding electrode when a number of substrates are repeatedly carried in, processed and then carried out. It is likely in the case of a substrate having large heat conductivity such as a silicon wafer that the substrate has the same temperature change as the substrate holding electrode surface. The solid and dotted lines show the temperature change when the heat exchangers of this embodiment and the prior art are employed, respectively. In the drawing, $t_0$ stands for a processing period for each substrate.

The surface temperature of the substrate holding electrode rises gradually and reaches the steady state after a plurality of substrates are processed. After that, the stable etching processing can be carried out. In this embodiment, as mentioned above, the temperature rise $T_A$ from the processing beginning to the steady state is small as compared with the temperature difference $T_B$ of the prior art, and the temperature reaches the steady state in shorter time ($t_A < t_B$). The number of dummy substrates which will be processed until the steady state is reduced. Thus, the useless processing is reduced to improve the productivity.

Even after reaching the steady state, the etched shapes and etching rate have been found to greatly fluctuate, depending on the temperature rise T' within the processing period to and the time to reach T'.

This phenomenon may be explained by the fact that the amount of a polymer film generated from the etching gas remarkably varies with the temperature during the etching processing. When the amount of film adhesion is proper, the film adheres to the sidewall in the hole to prevent the etching in the transverse direction and form holes having a nearly vertical sidewall. In contrast, when the film adheres too much, the etching rate in the depth direction decreases and becomes non-uniform. And the etching is sometimes stopped. For this reason, the processing conditions such as oxygen amount added in etching gas and a RF power are optimized, depending on the substrate temperature. However, since the temperature rise of substrate ($T_B'$) is large and the time ($t_B'$) to reach the stabilized state is long in the prior art, it is not possible to cope with smaller contact holes or form holes having a vertical sidewall even by optimizing the oxygen amount.

On the other hand, in the present embodiment where the substrate temperature variation is small ($T_A' < T_B'$) and the temperature is stabilized in a short time ($t_A' < t_B'$), the conditions can be easily optimized to form vertical sidewall insides small contact holes with a large aspect ratio.

Figure 5:
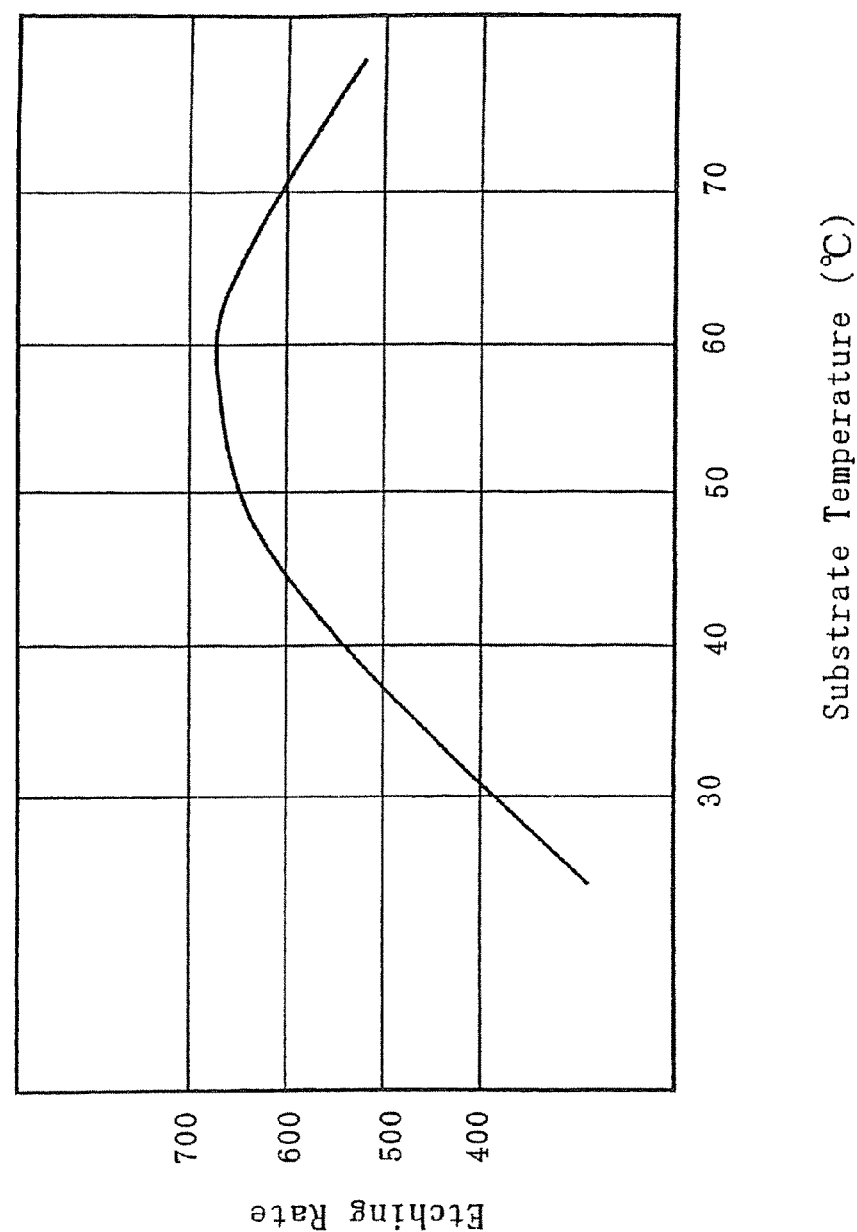
FIG. 5 is a graph showing the relation between substrate temperature and etching rate.
Figure 6:
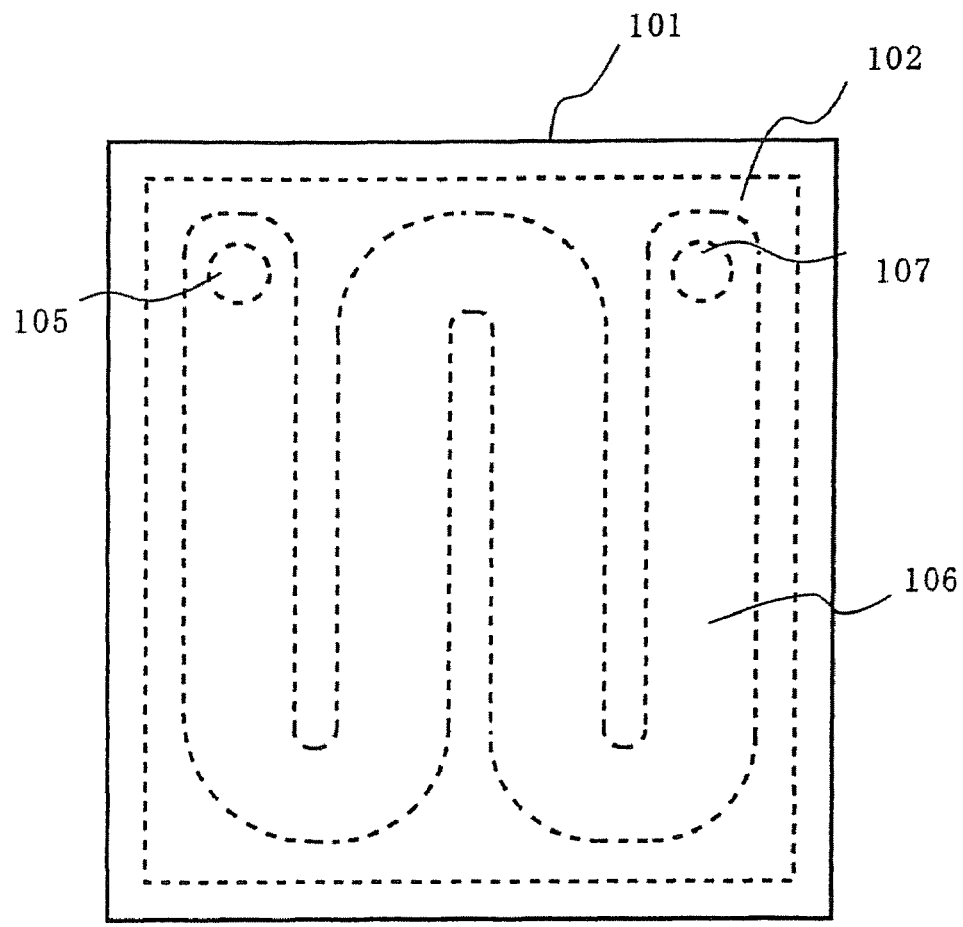
FIG. 6 is a plan and a cross sectional views showing a heat exchanger of target backing plate.
Figure 6:
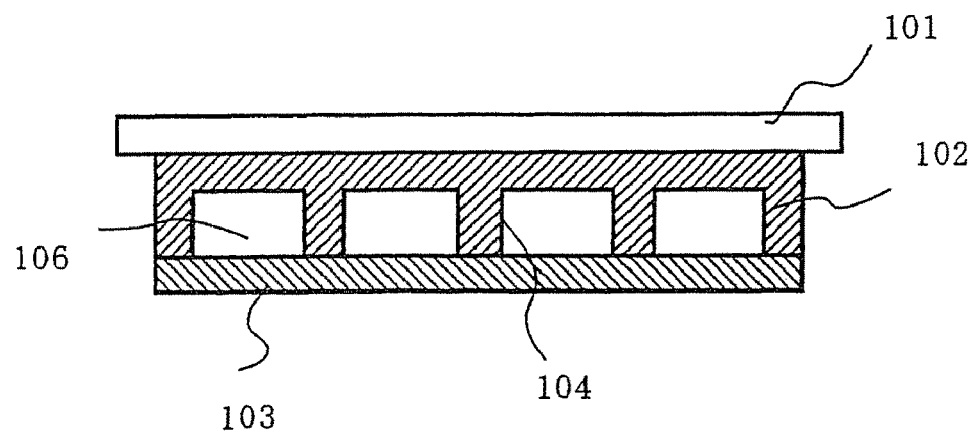

As an example, the relation of the substrate temperature and the etching rate for $SiO_2$ film is shown in FIG. 5, which is obtained using the apparatus shown in FIG. 2.

The pressure was set to 4 Pa, using $C_4F_8$ (13.3 ml/min)/Ar (300 m l/min)/$O_2$ (6 ml/min) as etching gas. The electric powers of 1.8 kW (60 MHz) and 1.8 kW (16 MHz) were supplied to the opposite electrode and the substrate holding electrode, respectively, to carry out the etching processing. Here, in order to further improve the heat transfer between the electrostatic chuck and the substrate, the electrostatic absorption force was set to be 1 kgf/cm$^2$, and He gas was introduced to the backside of substrate from through holes 20 at a pressure of 4 kPa and at a flow rate of 0.5 sccm. The opposite electrode was set to be at 60° C.

When the temperature difference was made less than 0.5° C. over the entire substrate surface at the substrate temperature of for example 50° C., the contact holes formed had a vertical side wall and a uniformity of 1% or less for 0.13 μm contact holes. The heat exchanger shown in FIG. 3 is also used for, e.g., the gas emitting means (opposite electrode) of etching apparatus.

The heat exchangers to cool the substrate using coolant have been explained so far. However, it is also possible to keep a substrate and the like at a high temperature using hot fluid instead of coolant. In addition, there is no restriction in the fluid used for a heat exchanger, and therefore a variety of fluids such as water and Fluorinert (Trade Mark) are employed instead of GALDEN. Moreover, the plate constituting a heat exchanger is not necessarily flat. The curved member is also used.

The heat exchanger and substrate holder of this invention are preferably used for controlling the temperature of opposite electrode, gas emitting means, substrate holding mechanism and process chamber wall of plasma CVD apparatus and thermal CVD apparatus as well as etching apparatuses described above. Furthermore, the heat exchanger and substrate holder are also applied to an ion implantation apparatus and an annealing apparatus, and a substrate holder of aligner or stepper.

As has been mentioned, the present invention makes it possible to efficiently control and maintain, e.g., a substrate at a predetermined temperature through the heat transfer with the aid of high-density fins. The substrate is uniformly cooled or heated at constant temperature to improve the uniformity of processing and prevent, e.g., an electrostatic chuck used for, e.g., a substrate holder from bending or cracking.

Accordingly, it is possible in the etching processing to make uniform the etching rate, resist selection ratio, selection ratio in a hole, contact hole shape, and residual amount all over the substrate. The more uniform deposition rate can be obtained for a thermal CVD and a plasma CVD processing, and the more uniform ashing rate can be realized.

What is claimed is:

1. A semiconductor device manufacturing method using an apparatus having a substrate holder, a gas emittor, and a heat exchanger in a process chamber, the heat exchanger comprising:
   a first plate;
   a second plate facing said first plate;
   a fluid channel wall having no end, the fluid channel wall arranged between said first plate and said second plate to form a fluid channel for a fluid;
   an introduction port for introducing said fluid into said fluid channel;
   a discharge port for discharging said fluid from said fluid channel;
   a discontinuous first fin having a plurality of substantially aligned first fin segments extending in an arcuate shape, a gap of a first length extending between adjacent ones of the first fin segments, said discontinuous first fin being disposed on said first plate and inside said fluid channel along said channel, and a height of the discontinuous first fin being less than the distance between said two plates; and
   a discontinuous second fin having a plurality of substantially aligned second fin segments extending in an arcuate shape, a gap of a second length extending between adjacent ones of the second fin segments, said discontinuous second fin being disposed on said second plate and inside said fluid channel along said fluid channel, and a height of said discontinuous second fin being less than the distance between said two plates, wherein said discharge port is formed in one of the gaps;
   the method comprising
   positioning a substrate on the substrate holder;
   flowing a fluid inside said fluid channel; and
   causing plasma of the gas to process said substrate.

* * * * *